United States Patent [19]
Chillara et al.

[11] Patent Number: 5,569,955
[45] Date of Patent: Oct. 29, 1996

[54] HIGH DENSITY INTEGRATED CIRCUIT ASSEMBLY COMBINING LEADFRAME LEADS WITH CONDUCTIVE TRACES

[75] Inventors: Satya Chillara; Shahram Mostafazadeh, both of San Jose, Calif.

[73] Assignee: National Semiconductor Corporation, Santa Clara, Calif.

[21] Appl. No.: 406,726

[22] Filed: Mar. 20, 1995

Related U.S. Application Data

[63] Continuation-in-part of Ser. No. 307,270, Sep. 16, 1994, Pat. No. 5,442,230.
[51] Int. Cl.[6] ................................................ H01L 23/495
[52] U.S. Cl. ..................... 257/666; 257/693; 257/700; 257/701
[58] Field of Search ...................................... 257/666, 676, 257/668

[56] References Cited

U.S. PATENT DOCUMENTS

| | | | |
|---|---|---|---|
| 5,332,864 | 7/1994 | Liang et al. | 174/52.4 |
| 5,442,230 | 8/1995 | Chilara et al. | 257/666 |

FOREIGN PATENT DOCUMENTS

| | | | |
|---|---|---|---|
| 56-51851 | 5/1981 | Japan | 257/666.2 |
| 62-54456 | 3/1987 | Japan . | |
| 01106436 | 4/1989 | Japan . | |
| 04127563 | 4/1992 | Japan . | |
| 05283460 | 10/1993 | Japan . | |
| 06097307 | 4/1994 | Japan . | |
| 06232320 | 8/1994 | Japan . | |
| 07086335 | 3/1995 | Japan . | |
| 07122701 | 5/1995 | Japan . | |

OTHER PUBLICATIONS

Hashemi Hassan et al: "A Mixed Solder Grid Array and Peripheral Leaded MCM Package" 1 Jun. 1993, proceedings of the electronic components and technology conference, Orlando, pp. 951–956.

Primary Examiner—Sara W. Crane
Assistant Examiner—Roy Potter
Attorney, Agent, or Firm—Hickman Beyer & Weaver

[57] ABSTRACT

An integrated circuit assembly is disclosed herein. The assembly includes a dielectric substrate defining a predetermined array of electrically conductive traces and an array of solder balls electrically connected to the traces. An integrated circuit chip having a series of input/output pads is supported on the substrate. In one embodiment, a plurality of leadframe leads are supported by the substrate in electrical isolation from and over the conductive traces. First and second series of bonding wires electrically connect certain ones of the input/output pads on the IC chip to the leadframe leads and conductive traces. In other embodiments, one or more electrically isolated conductive layers are supported by the dielectric substrate over the traces and leadframe leads. The integrated circuit assembly, in accordance with any of these embodiments, provides a very high density electrical interconnection arrangement for the IC chip while retaining a small package footprint.

13 Claims, 8 Drawing Sheets

HIGH DENSITY INTEGRATED CIRCUIT ASSEMBLY COMBINING LEADFRAME LEADS WITH CONDUCTIVE TRACES

This application is a Continuation-in-Part application Ser. No.: 08/307,270, filed Sep. 16, 1994, now U.S. Pat. No. 5,442,230 which is incorporated herein by reference.

BACKGROUND OF THE INVENTION

The present invention relates generally to an integrated circuit assembly, and more particularly to an assembly wherein a plurality of leadframe leads are supported on a dielectric substrate, itself defining a plurality of electrically conductive traces. The leadframe leads are electrically isolated from the conductive traces. The assembly may also include one or more electrically conductive layers supported by the substrate and used for additional electrical interconnections.

In the field of integrated circuits, the physical size of an integrated circuit assembly is a primary concern. As technology has improved and functionality of integrated circuit chips has increased, the number of electrical interconnections required by a typical individual IC chip within an integrated circuit assembly has steadily increased. Very high density electrical interconnection arrangements within the integrated circuit package are now required to provide the needed number of electrical connections to interface the integrated circuit chip to the outside world. At the same time, the need for the overall integrated circuit assembly to retain as small a footprint as possible remains a primary consideration. In the prior art, a leadframe was typically used to provide electrical connections to the IC chip. As higher numbers of connections were required, the width of individual leadframe leads was simply decreased and the spacing between the leads was also decreased, thereby increasing the number of leads per inch. This is an acceptable solution up to a point. As the width of the leads and the spacing therebetween is decreased, the IC assembly becomes increasingly more difficult to manufacture and the reliability of the assembly is reduced. Therefore, other solutions have been proposed, as will be discussed immediately below.

FIGS. 1 and 1A illustrate a prior art integrated circuit assembly generally indicated by the reference numeral 10. The assembly utilizes an arrangement which does not include a leadframe but, nevertheless attempts to achieve a high density of electrical interconnections. The assembly includes a dielectric substrate 12 having a top surface 14, a side surface 15 and a bottom surface 16. A plurality of solder balls 18 are attached to bottom surface 16 in a grid array. Substrate 12 defines a plurality of electrically conductive traces, a representative example of which is shown at reference numeral 20. Conductive trace 20 comprises a first portion 20A integral with top surface 14 of the substrate, a second portion 20B which is a via that goes through the substrate and a third portion 20C integral with the bottom surface 16 of the substrate. As may be seen in the figures, conductive trace 20 is routed from the top surface of the substrate to the bottom surface through the via 20b.

An IC chip 22 having a plurality of input/output pads 24 is supported on top surface 14 of the substrate. A plurality of bonding wires 26 electrically connect the input/output pads on IC chip 22 to the conductive traces. For example, bonding wire 26A is electrically connected to input/output pad 24A on IC 22 at one end and at its other end is electrically connected to conductive trace 20A. Solder ball 18A is electrically connected to the third portion of conductive trace 20A on the bottom surface of the substrate, whereby input/output pad 24A is electrically connected to solder ball 18A by means of bonding wire 26A, and conductive trace 20. Each respective solder ball within the grid array is electrically connected to a respective input/output pad on the IC chip in this manner.

This prior art assembly, illustrated in FIGS. 1 and 1A allows for a significant number of electrical interconnects and, since the solder balls 18 may be distributed over the entire bottom surface 18, the problems with interconnection to very fine leadframe leads, as discussed above, are avoided. Nevertheless, the number of interconnections possible using this approach is still quite limited, given the advancements in IC chip technology. As will be described hereinafter, the present invention provides for an arrangement which is capable of almost doubling the number of reliable electrical interconnections which are possible without enlarging the footprint of the IC assembly.

SUMMARY OF THE INVENTION

As will be described in more detail hereinafter, an integrated circuit assembly is herein disclosed. The assembly, like the assembly illustrated in FIGS. 1 and 1A, includes a dielectric substrate which has a predetermined array of electrically conductive traces and which supports an integrated circuit chip having a series of input/output pads. However, in accordance with a first feature of the present invention, a plurality of leadframe leads are supported by the substrate and electrically isolated from the conductive traces. A first series of bonding wires electrically connects certain ones of the input/output pads on the IC chip to the leadframe leads and a second series of bonding wires electrically connects respective other ones of the input/output pads on the IC chip to the conductive traces.

In accordance with a second feature of the present invention, an electrically conductive layer is supported on the leadframe and is electrically isolated from the leads. A bonding wire electrically connects the conductive layer to a predetermined one of the leadframe leads or conductive traces and at least one bonding wire electrically connects the conductive layer to at least one predetermined terminal pad on the IC chip, wherein the layer may function, for example, as a power or ground plane.

In accordance with a third embodiment of the present invention, first and second conductive layers are positioned in a stacked relationship and supported on the leadframe over at least some of the conductive traces and leadframe leads. Each of the respective conductive layers is electrically interconnected to the IC chip by means of bonding wires, and each conductive layer is electrically connected to any predetermined respective leadframe lead or respective conductive trace in accordance with a predetermined circuit design wherein the layers may function as, for example, power and ground planes, respectively.

All embodiments of the present invention herein disclosed achieve a very high density of electrical interconnections for the IC chip while, at the same time, the package footprint is typically smaller than that of a prior art leadframe based package having an identical pin count. It should be noted that in the embodiments of the present invention wherein one or more electrically conductive layers are used as power or ground planes, an improvement in the electrical performance of the integrated circuit assembly can be realized due to a decrease in the inductance of the power and ground interconnections. This advantage is achieved and maximized by keeping the bonding wires which interconnect the conductive planes to the IC chip and power source terminations as short as possible.

BRIEF DESCRIPTION OF THE DRAWINGS

The present invention may be understood by reference to the following detailed description taken in conjunction with the drawings in which.

DETAILED DESCRIPTION OF THE INVENTION

Figure 1:
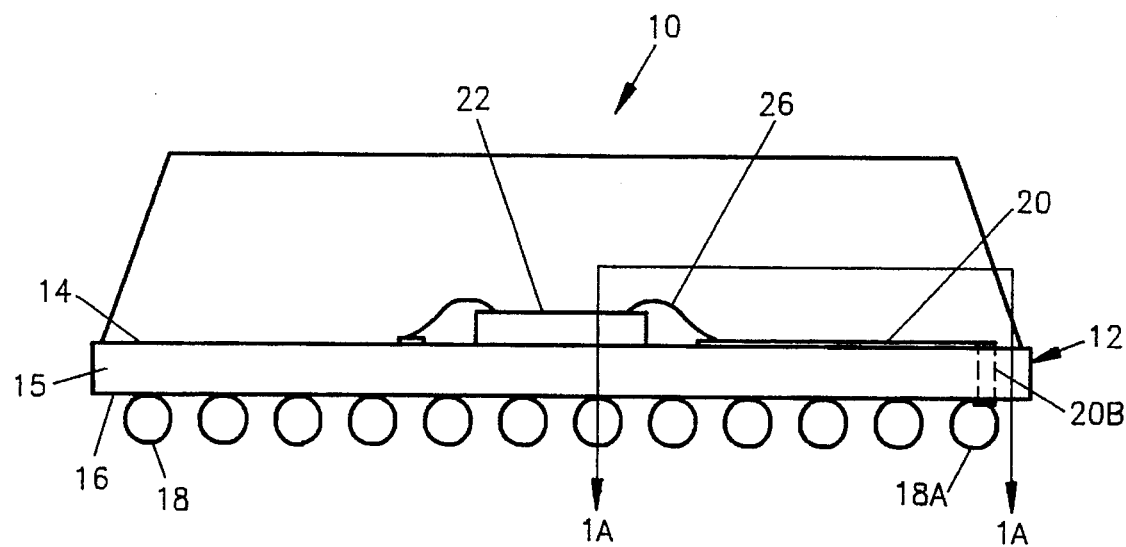
FIG. 1 is an elevational diagrammatic illustration of an integrated circuit assembly according to the prior art.
Figure 1A:
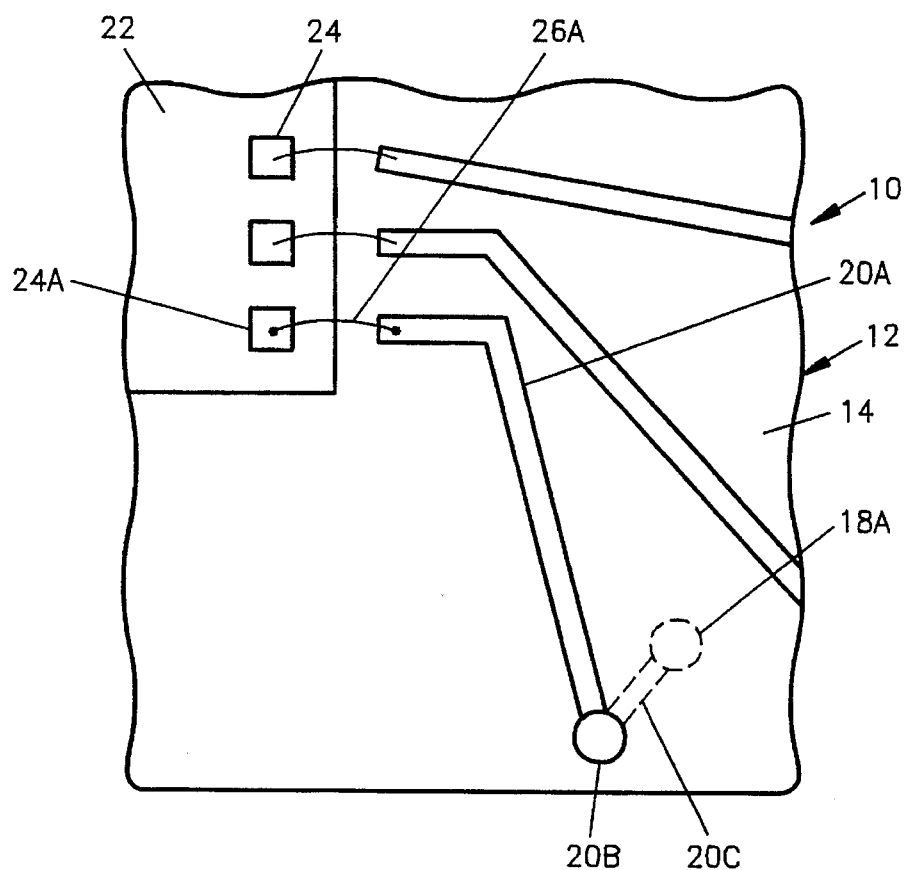
FIG. 1A is a diagrammatic sectional plan view of the assembly of FIG. 1
Figure 2:
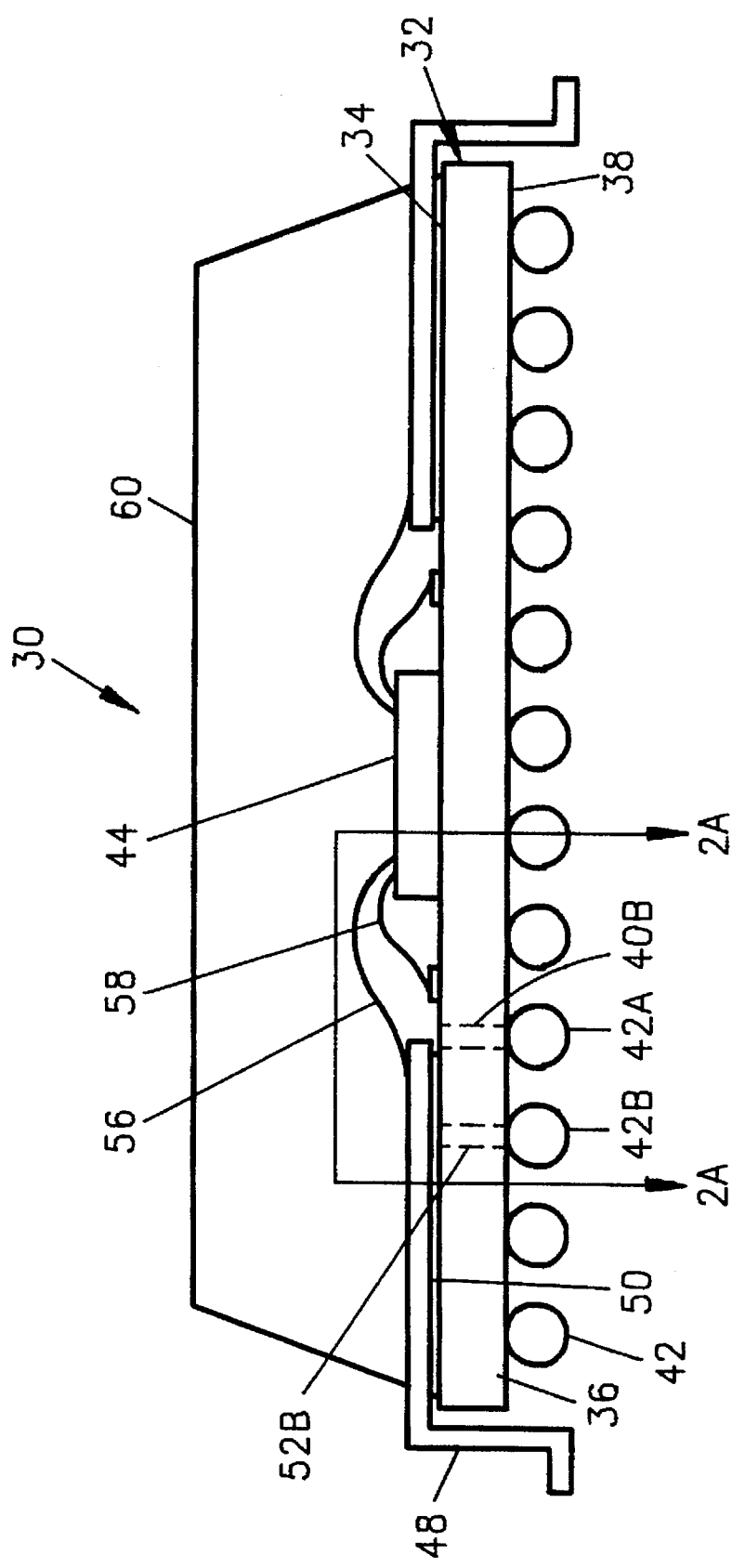
FIG. 2 is an elevational diagrammatic illustration of an integrated circuit assembly designed in accordance with a first embodiment of the present invention.
Figure 2A:
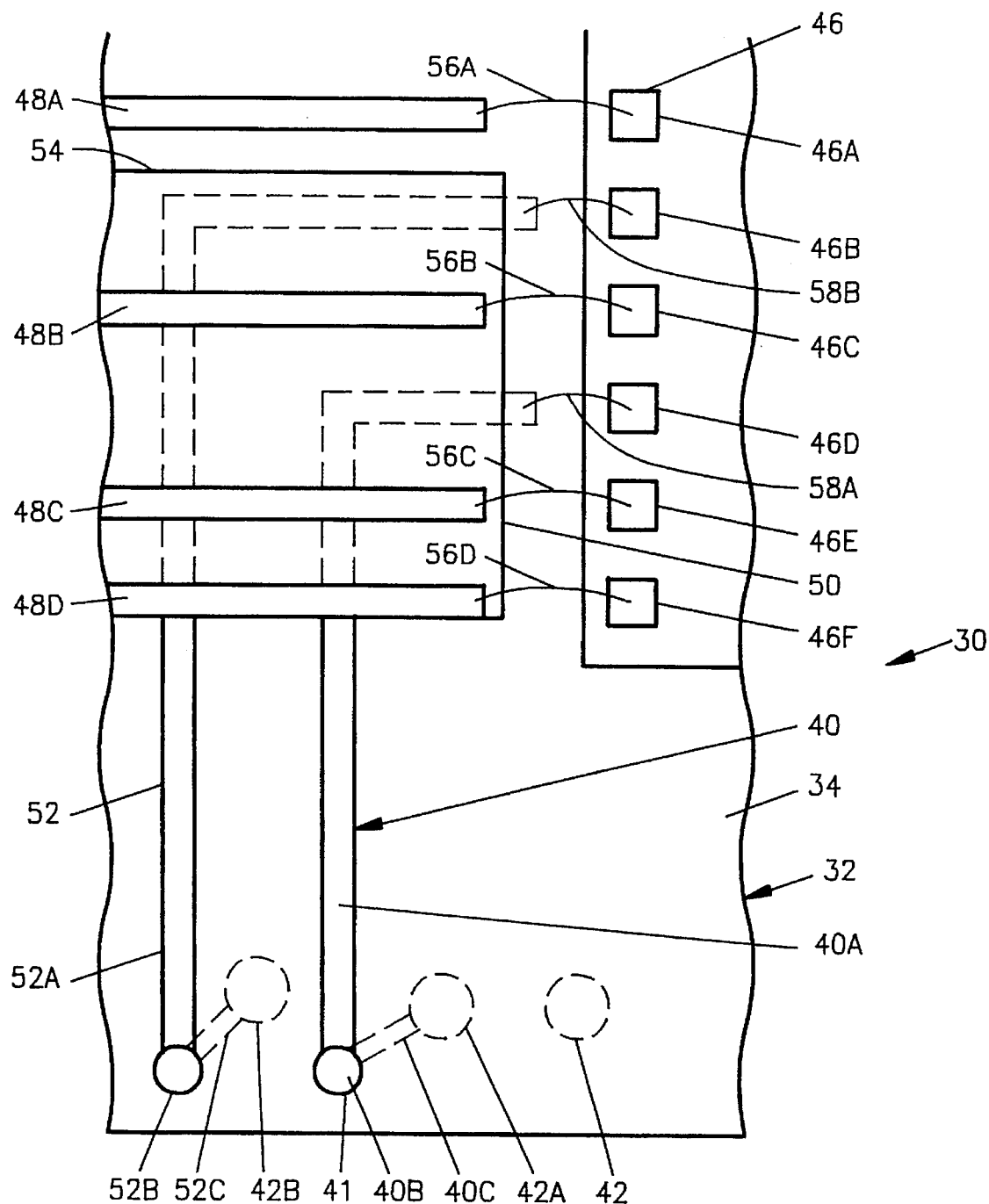
FIG. 2A is a diagrammatic sectional plan view of the assembly of FIG. 2.

Having described FIGS. 1 and 1A previously, attention is immediately directed to FIGS. 2 and 2A, which illustrate an integrated circuit assembly generally designated by the reference numeral 30 and designed in accordance with the present invention. The assembly includes a dielectric substrate 32 having a top surface 34, a side surface 36, and a bottom surface 38. The substrate 32 defines a plurality of conductive traces, one of which is shown at 40. As may be seen in FIGS. 2 and 2A, conductive trace 40 comprises a first portion 40A integral with the top surface 34 of substrate 32, a second portion 40B passing through a via 41 extending from the top surface to the bottom surface of substrate 32, and a third portion 40C, integral with the bottom surface 38 of the substrate 32. A plurality of solder balls 42 are attached to the bottom surface 38 of the substrate 32. A respective solder ball 42A is electrically connected to third portion 40C of conductive trace 40 on bottom surface 38 of the substrate. The particular trace shown here is routed from top surface 34 to bottom surface 38 through via 41. It should be understood that conductive traces may be routed from the top surface to the bottom surface of the substrate around the side of the substrate. Any of these means are compatible with the present invention and may be used in any embodiment of the present invention to electrically route the conductive traces from the top surface to the bottom surface of the substrate where they are connected to respective solder balls.

The assembly further includes an IC chip 44 supported on top surface 34 of the substrate wherein the IC chip includes a series of input/output pads: 46A, 46B, 46C, 46D, 46E and 46F. In accordance with the present invention, a plurality of leadframe leads 48A, 48B, 48C and 48D are supported by the substrate on top surface 34 in electrically isolated relationship with traces 40. In some, if not all cases, these leadframe leads cross over adjacent underlying traces. For example, the leadframe leads 48C and 48D shown in FIG. 2A overlie conductive trace portion 40A. The leadframe leads are electrically isolated from portion 40A of conductive trace 40 by a layer of insulating material 50, as illustrated in FIG. 2. A variety of insulating materials such as a dielectric tape or a non-conductive epoxy may be used to provide the electrical isolation between the leadframe leads 48C and 48D and first portion 40A of conductive trace 40. These materials may further serve to bond the leadframe leads to the substrate in accordance with the present invention. An additional conductive trace 52 having a first portion 52A integral with the top surface 34, a second portion 52B going through top surface 34 to bottom surface 38 and a third portion 52C integral with the bottom surface 38 of the substrate is shown in FIGS. 2 and 2A. Leadframe leads 48B, 48C and 48D overlie first portion 52A of conductive trace 52. These lead frame leads are also electrically isolated from the trace 52 by insulating material 50.

While the leadframe leads, as discussed above, generally overlie the conductive traces, selective placement and arrangement of leadframe leads on the substrate can provide electrical isolation of the leadframe leads from the conductive traces without the need for a dielectric layer. For example, leadframe lead 48A, in FIG. 2A, does not cross a conductive trace. A spaced relationship is maintained from leadframe lead 48A and portion 52A of conductive trace 52. As a result of this placement and arrangement of leadframe lead 48A, the leadframe lead is electrically isolated from the conductive traces and the electrical isolation provided by dielectric layer 50 is not needed between leadframe lead 48A and the substrate. Therefore, dielectric layer 50, as shown in FIG. 2A, includes an outer edge 54 with leadframe lead 48A arranged so as to be supported directly on top surface 34 of the substrate. Any leadframe lead may be isolated from the conductive traces in this manner. If all leadframe leads are so isolated by selective placement and arrangement upon the substrate to avoid crossing a conductive trace and maintaining a spaced relationship between the leadframe leads and the conductive traces, dielectric layer 50 is not required and a production cost savings may be realized.

Still referring to FIGS. 2 and 2A, a first series of bonding wires 56 electrically connects the leadframe leads to selected ones of the input/output pads on IC chip 44. Bonding wire 56A electrically connects leadframe lead 48A to input/output pad 46A on IC chip 44. Bonding wires 56B, 56C and 56D similarly electrically connect leadframe leads 48B, 48C and 48D to respective ones of the input/output pads 46C, 46E and 46F on IC chip 44. A second series of bonding wires 58 electrically connect the conductive traces to respective ones of the bonding pads on IC chip 44. Bonding wire 58A electrically connects first portion 40A of conductive trace 40 to input/output pad 46D. Bonding wire 58B electrically connects portion 52A of conductive trace 52 to input/output pad 46B. Conductive trace 52 is routed from top surface 34 to bottom surface 38 of substrate 32 by second portion 52B of trace 52. The trace further continuing on bottom surface 38 of the substrate where it is electrically connected to solder ball 42B. The IC assembly is partially encapsulated in a dielectric medium 60.

Figure 3:
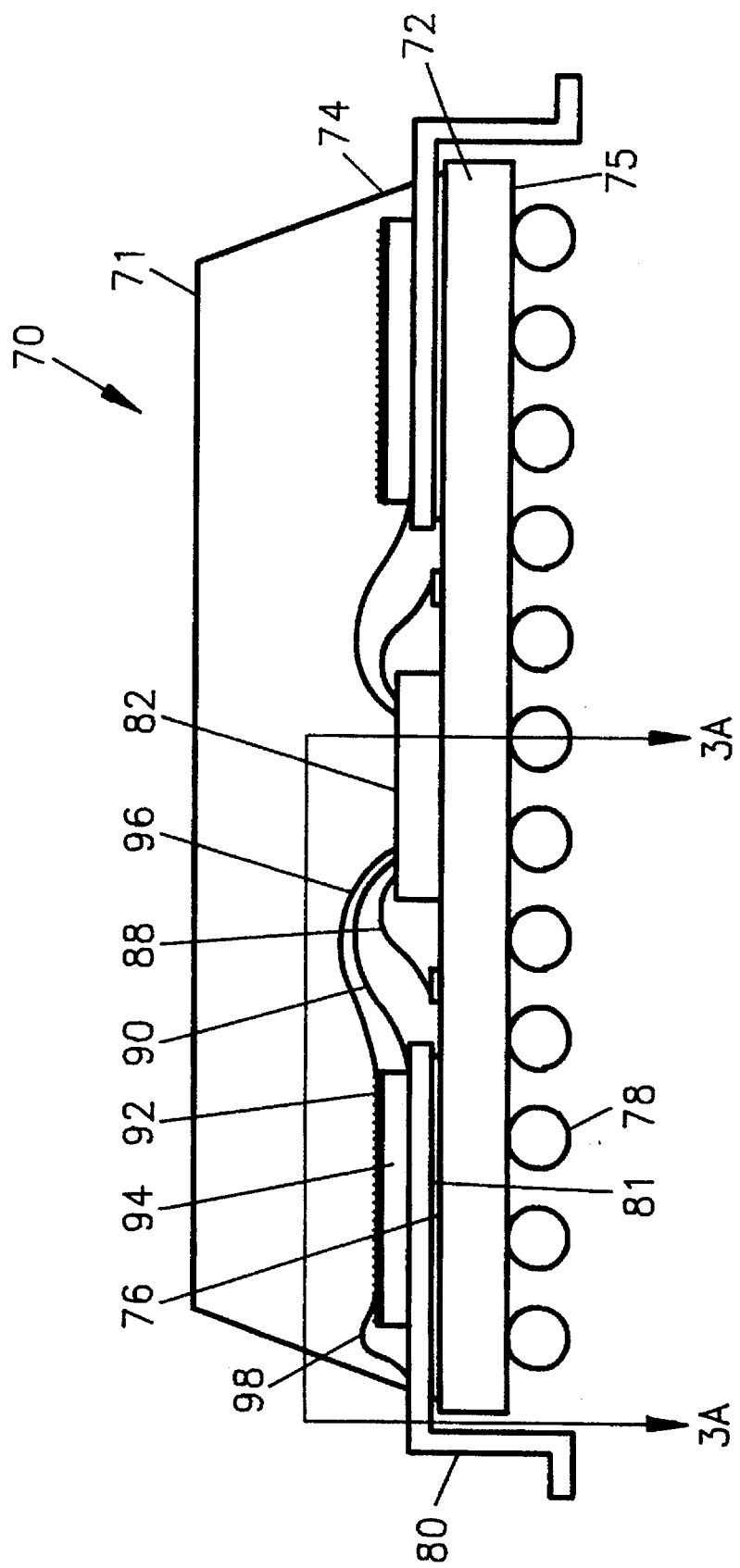
FIG. 3 is an elevational diagrammatic illustration of an integrated circuit assembly designed in accordance with a second embodiment of the present invention.
Figure 3A:
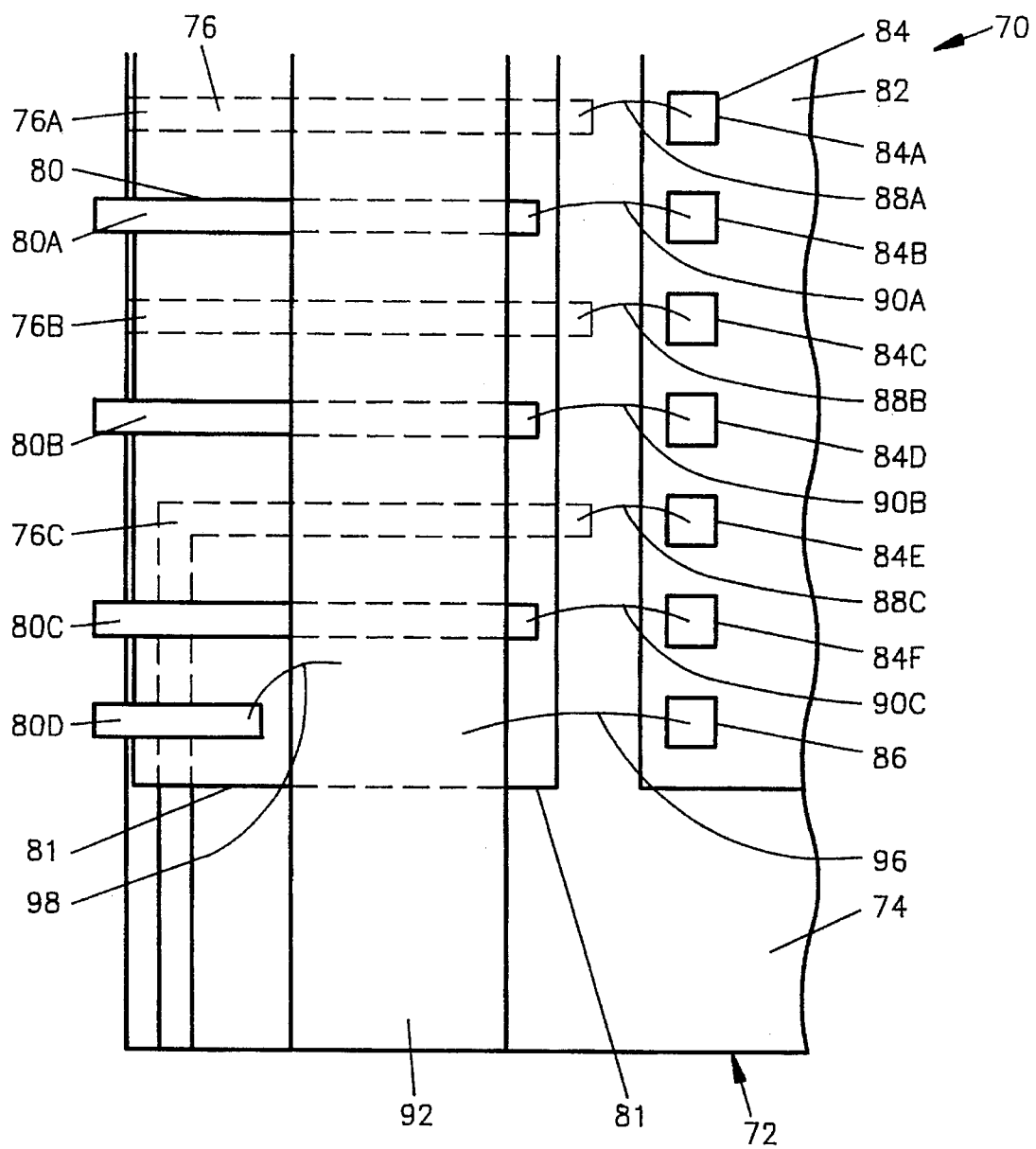
FIG. 3A is a diagrammatic sectional plan view of the assembly of FIG. 3.

FIGS. 3 and 3A illustrate an integrated circuit assembly, generally designated by the reference numeral 70. The assembly is partially encapsulated in a dielectric medium 71. The assembly includes a dielectric substrate 72 having a top surface 74 and a bottom surface 75. The substrate defines a plurality of electrically conductive traces 76. A plurality of solder balls 78 are attached to bottom surface 75 of the substrate and each conductive trace 76 is electrically attached to a respective one of the solder balls as previously described in the discussion referring to FIGS. 2 and 2A. In accordance with the present invention, a plurality of leadframe leads 80 are supported by substrate 72 on its upper surface 74. An insulating layer 81 electrically insulates the leadframe leads from the conductive traces in the case where the leadframe leads overlie the traces. In fact, whether or not the leads cross over traces, layer 81 extends between substrate 72 (including all traces) and the entire leadframe. For example, leadframe leads 80C and 80D overlie conductive trace 76C as shown in FIG. 3A, but due to the presence of insulating layer 81 electrical isolation is maintained between these leadframe leads and conductive trace 76C there below, as described previously. An IC chip 82 having a series of input/output pads 84 is supported on the upper surface 74 of substrate 72. The IC chip also includes an additional terminal 86, which may be, for example, a power or ground terminal in accordance with the present invention. A first series of bonding wires 88 electrically connect the conductive traces to respective ones of the input/output pads on IC chip 82. Bonding wires 88A, 88B and 88C each electrically connect a respective one of conductive traces 76A, 76B and 76C to a respective one of input/output pads 84A, 84C and 84E. A second series of bonding wires 90 electrically connect the leadframe leads to respective ones of the input/output pads on IC chip 82. Bonding wires 90A, 90B and 90C each electrically connect a respective one of leadframe leads 80A, 80B and 80C to a respective one of input/output pads 84B, 84D and 84F.

In accordance with the present invention, an electrically conductive layer 92 is supported on upper surface 74 of substrate 72 over at least some of leadframe leads 76 and, in a preferred embodiment, serves as either a power or ground plane. As may be seen in FIG. 3A, conductive layer 92 overlies leadframe leads 80A, 80B and 80C. Conductive layer 92 is electrically isolated from the leadframe leads by an insulating layer 94 disposed between the leadframe leads and the conductive layer. A variety of materials may be used within the scope of the present invention as insulating layer 94. Dielectric tape and non-conductive epoxy are several examples of materials suited to function as the insulating layer. The insulating layer may further serve to bond conductive layer 92 to the substrate, as is the case with both non-conductive epoxy and dielectric tape. If other materials are used for the insulating layer a separate adhesive may be used as a bonding agent.

A bonding wire 96 electrically connects additional terminal 86 of IC chip 82 to electrically conductive layer 92. A bonding wire 98 electrically connects leadframe lead 80D to electrically conductive layer 92 whereby additional terminal 86 of IC chip 82 is electrically connected to the leadframe lead via the bonding wire and the electrically conductive layer. In the case where conductive layer 92 serves as either a power or ground plane, bonding wires 96 and 98 should be kept as short as possible to minimize inductance in these interconnections. It is mentioned here that bonding wire 98 may alternatively be electrically connected from a preselected one of the conductive traces such as 76B to the conductive layer 92 (not shown). In fact, the conductive layer may be electrically connected to any conductive trace or leadframe lead, within the scope of the present invention. Leadframe lead 80D may be at ground potential in which case the electrically conductive layer 92 will serve as a ground plane and additional terminal 86 on IC chip 82 is grounded or leadframe lead 80D may alternatively represent a power terminal in which case conductive layer 92 will serve as a power plane and the additional terminal 86 of IC chip 82 is a power terminal in accordance with a predetermined circuit design and within the scope of the invention.

Figure 4:
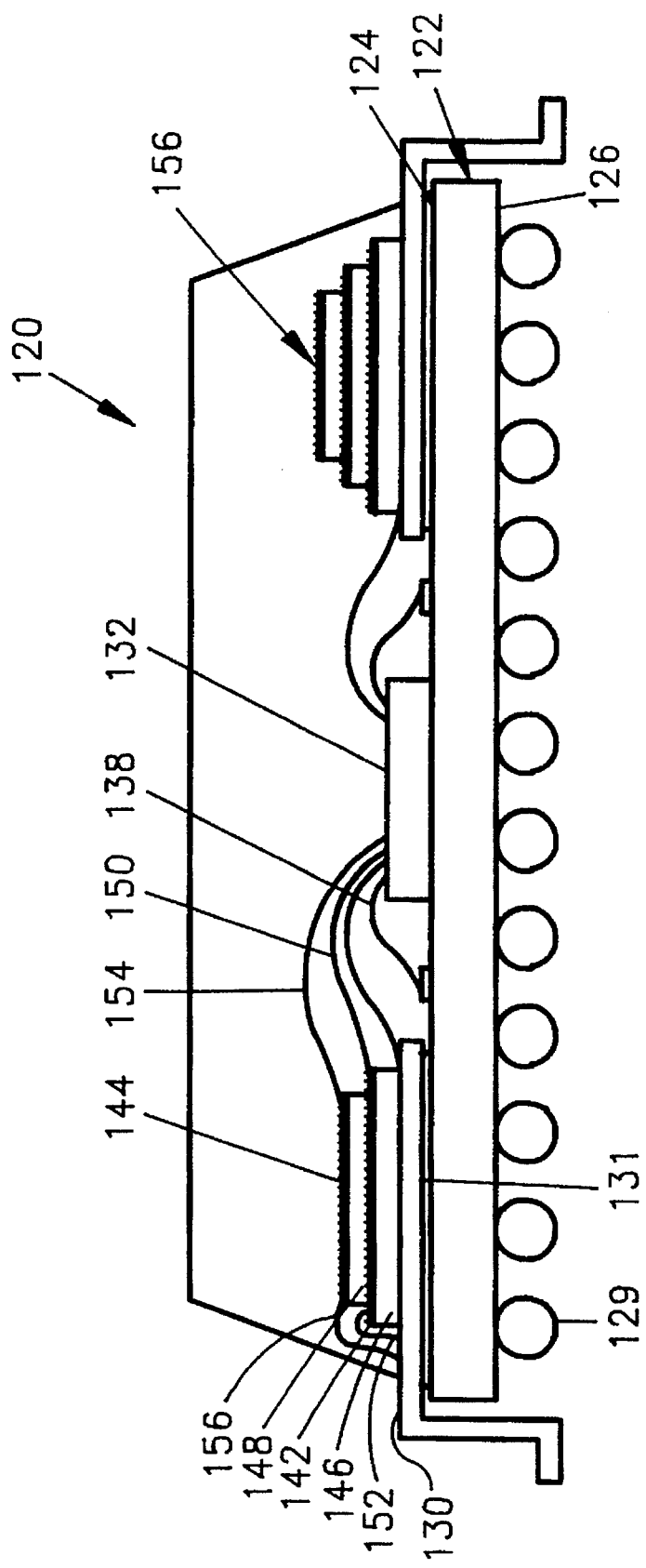
FIG. 4 is a elevational diagrammatic illustration of an integrated circuit assembly designed in accordance with a third embodiment of the present invention.
Figure 4A:
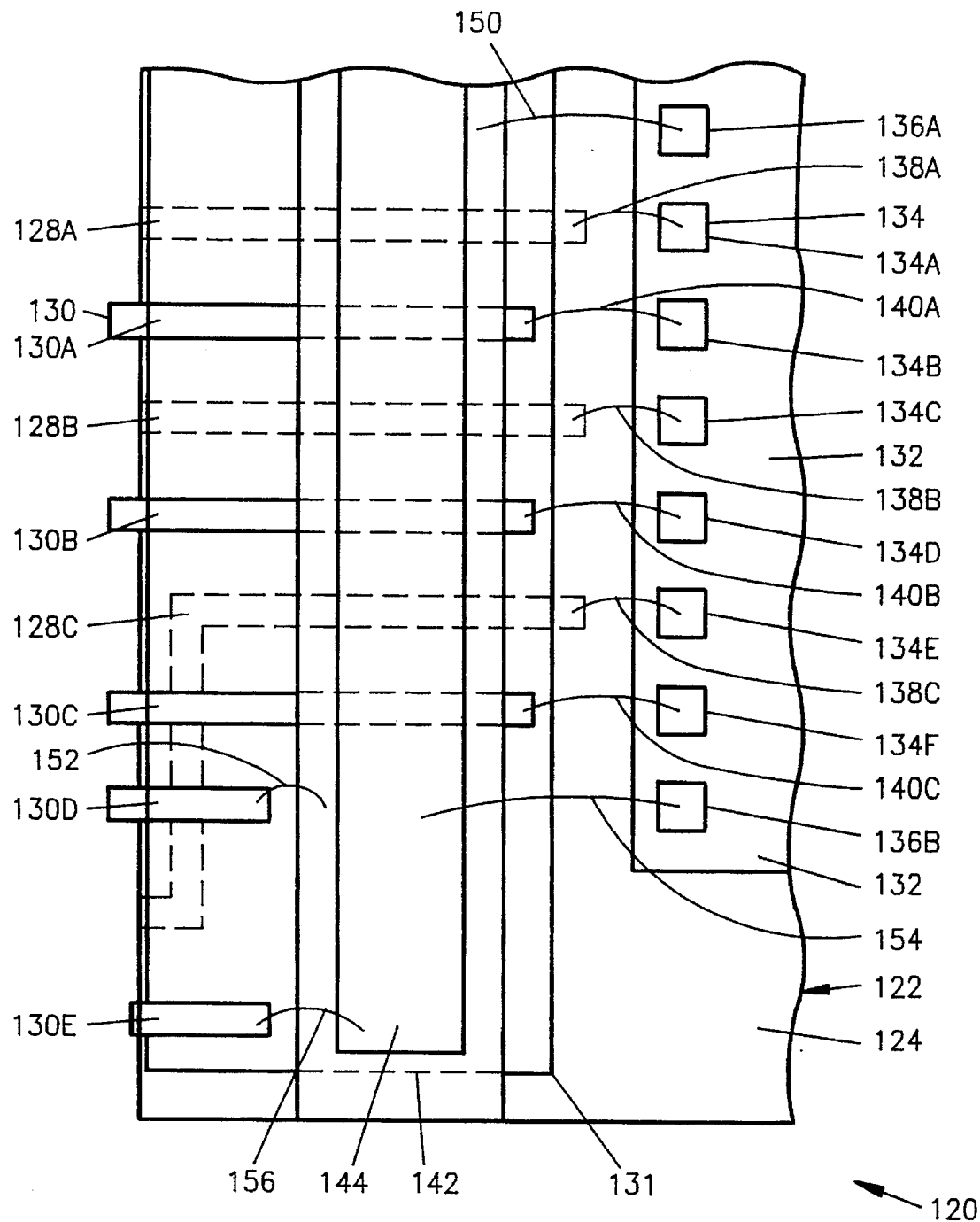
FIG. 4A is a diagrammatic sectional plan view of the assembly of FIG. 4.

The IC circuit assembly shown in FIGS. 4 and 4A depicts still another embodiment of the present invention. These figures illustrate an integrated circuit assembly generally designated by the reference numeral 120. The assembly includes a dielectric substrate 122 having a top surface 124 and a bottom surface 126. The substrate defines a plurality of electrically conductive traces 128. A plurality of solder balls 129 are attached to bottom surface 126 of the substrate and each conductive trace 128 is electrically attached to a respective one of solder balls 129, as previously described in the discussion referring to FIGS. 2 and 2A. A plurality of leadframe leads 130 are supported by substrate 122 on its upper surface 124. An insulating layer 13 1 electrically isolates the leadframe leads from the conductive traces. For example, leadframe leads 130C and 130D overlie conductive trace 128C in FIG. 4A, but due to the presence of insulating layer 13 1 electrical isolation is maintained between these leadframe leads and conductive trace 128C there below. An IC chip 132 having a series of input/output pads 134 is supported on the upper surface 124 of substrate 122. In accordance with the present invention, the IC chip also includes at least two additional terminals 136A and 136B, which may be power and ground terminals in accordance with a predetermined circuit design. A first series of bonding wires 138 electrically connect certain ones of the conductive traces to respective ones of the input/output pads on IC chip 132. Bonding wires 138A, 138B and 138C each electrically connect a respective one of conductive traces 128A, 128B and 128C to a respective one of input/output pads 134A, 134C and 134E on the IC chip. A second series of bonding wires 140 electrically connect certain ones of the leadframe leads to respective ones of the input/output pads on IC chip 132. Bonding wires 140A, 140B and 140C each electrically connect a respective one of leadframe leads 130A, 130B and 130C to a respective one of input/output pads 134B, 134D and 134F.

In accordance with the present invention, a first electrically conductive layer 142 and a second electrically conductive layer 144 are positioned in a stacked relationship on the upper surface of substrate 122 over at least some of the leadframe leads 130. A first insulating layer 146 electrically insulates first conductive layer 142 from leadframe leads 130A, 130B, and 130C; and a second insulating layer 148 electrically insulates second conductive layer 144 from first conductive layer 146, wherein the layers are electrically isolated from one another and from the leadframe leads thereunder. As described previously, each individual layer 142 and 144 may be electrically connected to any respective conductive trace or leadframe lead available in the IC assembly using cooperating bonding wires described previously. The respective leadframe lead or conductive trace to which each conductive layer is electrically connected may comprise a power terminal or a ground terminal according to a predetermined circuit design and in accordance with the invention as claimed. For the purpose of illustration, first layer 142 will be electrically interconnected as a ground plane and second layer 144 will be electrically interconnected as a power plane in FIGS. 4 and 4A. First additional terminal 136A of IC chip 132 is electrically connected to first conductive layer 142 by bonding wire 150. Bonding wire 152 electrically connects first conductive layer 142 to leadframe lead 130D. If leadframe lead 130D is at ground potential, the first conductive layer is also at ground potential and comprises a ground plane, wherein a ground termination is provided to the IC chip by bonding wire 150. Second additional terminal 136B of IC chip 132 is electrically connected to second conductive layer 144 by bonding wire 154. Bonding wire 156 electrically connects second conductive layer 144 to leadframe lead 130E. If leadframe lead 130E is at power potential, the second conductive layer is also at power potential and comprises a power plane, wherein a power termination is provided to the IC chip via bonding wire 154. Bonding wires 150, 152, 154 and 156 should be kept as short as possible to minimize the inductance of the power and ground interconnections within the IC assembly. Also, the power and ground leads of the leadframe are short as it can be seen in FIG. 4A. The electrical interconnection of the first and second electrically conductive layers as shown illustrates one possible embodiment of the present invention. Many other embodiments for electrical interconnection of the electrically conductive layers are possible as taught by the disclosure herein. For example, a second stack of electrically isolated conductive layers 156 is supported on substrate 122 in the same manner as the stack comprised of layers 142 and 144. Either of these stacks and/or additional stacks may include two or more electrically isolated layers electrically connected to cooperating terminals on IC chip 132 and leadframe leads and/or traces in the manner described previously. Stack 156, which is shown including three such layers, is illustrated without bonding wires for purposes of simplicity. While the leadframe leads illustrated in the various embodiments may be provided in any suitable manner, one method to do so is to form a leadframe including leads and a die attach pad and thereafter eliminate the die attach pad.

Figure 5:
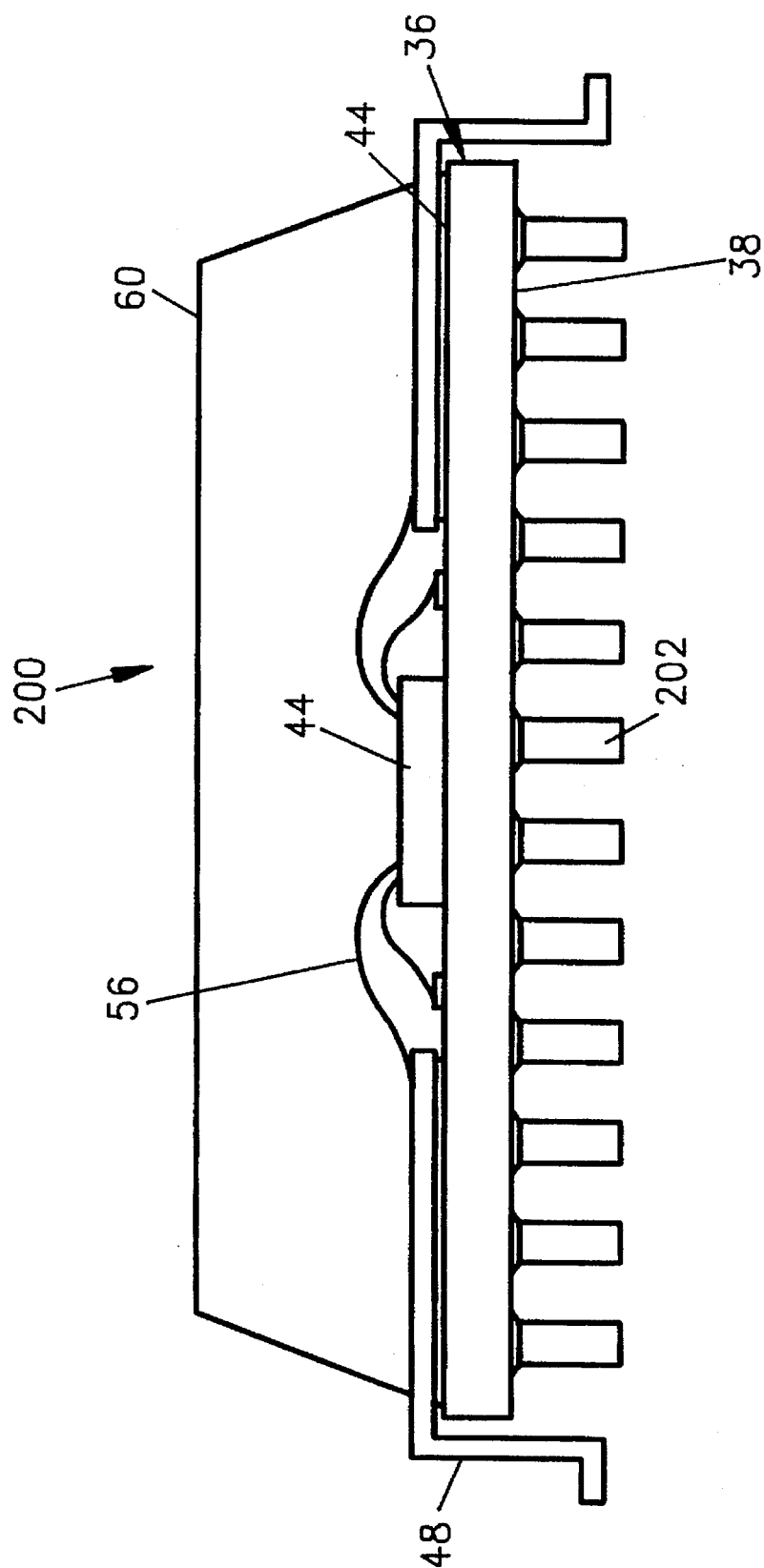
FIG. 5 is an elevational diagrammatic illustration of an integrated circuit assembly designed in accordance with a further embodiment of the present invention.

Referring now to FIG. 5, an assembly 200 designed in accordance to a further embodiment of the present invention is shown. Assembly 200 may be identical to assembly 30 illustrated in FIG. 2 and described above, with one exception. In place of the solder balls 42 forming part of assembly 30, assembly 200 uses elongated solder columns or attachment pins 202 connected to the underside of substrate 36 and traces 44 in the same manner as the solder balls. If solder columns are used a typical column might be 20 mils in diameter and 50–87 mils long. If attachment pins are used, a typical one might be 18 mils in diameter and 170 mils long. These dimensions are for illustrative purposes only and are not intended to limit the present invention. While not specifically shown, Assembly 200 could include the same stacked arrangement illustrated in FIGS. 3, 3A, 4 and 4A.

It should be understood that the present invention may be embodied in many other specific forms without departing from the spirit or scope of the invention. Therefore, the present examples are to be considered as illustrative and not restrictive, and the invention is not to be limited to the details given herein, but may be modified within the scope of the appended claims.

What is claimed is:

1. An integrated circuit assembly, comprising:
 a) a dielectric substrate defining a predetermined array of electrically conductive traces on a first surface thereof;
 b) a plurality of leadframe leads supported by said substrate and electrically isolated from said traces;
 c) an IC chip supported by the substrate on the first surface, said IC chip including a series of input/output pads; and
 d) a first series of bonding wires respectively electrically connecting certain ones of the input/output pads of the IC chip to respective ones of said traces and a second series of bonding wires respectively electrically connecting certain other ones of the input/output pads of the IC chip to respective ones of said leadframe leads, whereby the IC chip can be connected to external components in a predetermined way through both said electrically conductive traces and said leadframe leads
 e) said substrate further including at least said first surface and a second opposing surface, said first surface supporting said IC chip and said leadframe leads, said substrate further including a plurality of elongated, electrically conductive members attached to said second surface in predetermined positions, and wherein said conductive traces extend from said first surface to said second surface, each of said traces being electrically connected to an associated one of said elongated members.

2. An integrated circuit assembly according to claim 1 wherein said elongated members are attached to said second surface in a predetermined grid array.

3. An integrated circuit assembly according to claim 1 wherein each of said elongated members is a solder column.

4. An integrated circuit assembly according to claim 1 wherein each of said elongated members is an attachment pin.

5. An integrated circuit assembly, comprising:
 a) a dielectric substrate including a predetermined array of electrically conductive traces, said substrate further including opposing first and second surfaces such that said conductive traces extend from the first surface to the second surface, said substrate still further including a plurality of elongated members attached to said second surface in predetermined positions such that each member is electrically connected to a respective one of said conductive traces;
 b) a plurality of leadframe leads supported by said first surface of said substrate such that at least some of said leadframe leads overlie said conductive traces;
 c) an IC chip supported on the first surface of said substrate and including a series of input/output pads, at least one power terminal and at least one ground terminal;
 d) a first series of bonding wires respectively electrically connecting certain ones of said input/output pads of the IC chip to respective ones of said traces on said first surface and a second series of bonding wires respectively electrically connecting certain other ones of the input/output pads of the IC chip to respective ones of said leadframe leads on said first surface;
 e) first and second electrically conductive layers positioned in a stacked relationship with respect to one another on said substrate and overlying at least some of said leadframe leads, said layers selectively serving as power or ground planes, respectively;
 f) means for electrically insulating said layers from one another and from said leadframe leads therebelow; and
 g) means for electrically connecting said first and second layers to specific ones of said leadframe leads or conductive traces and further electrically connecting said first and second layers to respective power and ground terminals on said IC chip, whereby to provide preselectable power and ground planes for electrical interconnection of the IC chip.

6. An integrated circuit assembly according to claim 5 wherein each of elongated members is a solder column.

7. An integrated circuit assembly according to claim 6 wherein each of said elongated members is an attachment pin.

8. An integrated circuit assembly, comprising;

a) a dielectric substrate including a predetermined array of electrically conductive traces, said substrate further including opposing first and second surfaces such that said conductive traces extend from the first surface to the second surface, said substrate still further including a plurality of elongated members attached to said second surface in predetermined positions such that each elongated member is electrically connected to a respective one of said conductive traces;

b) a plurality of leadframe leads supported by said first surface of said substrate such that at least some of said leadframe leads overlie said conductive traces;

c) an IC chip supported on the first surface of said substrate and including a series of input/output pads, at least one power terminal and at least one ground terminal;

d) a first array of bonding wires respectively electrically connecting certain ones of the input/output pads of the IC chip to respective ones of said traces on said first surface and a second array of bonding wires respectively electrically connecting certain other ones of the input/output pads of the IC chip to respective ones of said leadframe leads on said first surface, whereby to externally electrically connect the IC chip in a predetermined way;

e) first and second electrically conductive layers positioned in a stacked relationship with respect to one another on said substrate and overlying at least some of said leadframe leads, said layers selectively serving as power or ground planes, respectively;

f) a dielectric material electrically insulating said first and second layers from one another and from said leadframe leads therebelow, wherein said dielectric material serves to bond said layers to one another and to the substrate;

g) a first series of bonding wires electrically connecting said first and second layers to specific ones of said leadframe leads or conductive traces, and a second series of bonding wires electrically connecting said first and second layers to respective preselected power or ground terminals on said IC chip, whereby to provide preselectable power or ground planes for electrical interconnection of the IC chip; and h) a dielectric material encapsulating at least a portion of said integrated circuit assembly.

9. An integrated circuit assembly according to claim 9 wherein each of said elongated members is a solder column.

10. An integrated circuit assembly according to claim 9 wherein each of said elongated members is an attachment pin.

11. An integrated circuit assembly comprising:

a) a dielectric substrate including a predetermined array of electrically conductive traces, said substrate further including opposing first and second surfaces such that said conductive traces extend from the first surface to the second surface, said substrate still further including a plurality of elongated members attached to said second surface in a grid array such that each member is electrically connected to a respective one of said conductive traces;

b) a plurality of leadframe leads supported by said first surface of said substrate such that at least some of said leadframe leads overlie said conductive traces;

c) an IC chip supported on the first surface of said substrate, said IC chip including a series of input/output pads and still further including additional electrical terminals;

d) a first array of bonding wires respectively electrically connecting certain ones of the input/output pads of the IC chip to respective ones of said traces on said first surface and a second array of bonding wires respectively electrically connecting certain other ones of the input/output pads of the IC chip to respective ones of said leadframe leads on said first surface;

e) first and second electrically conductive layers positioned in a stacked relationship with respect to one another on said substrate and overlying at least some of said leadframe leads, said layers selectively serving as conductive planes for preselectable electrical connection respectively to said IC chip in accordance with a predetermined circuit design;

f) a dielectric material electrically insulating said first and second layers from one another and from said leadframe leads there below such that said dielectric material serves to bond said layers to one another and to the substrate;

g) a first series of bonding wires electrically connecting said first and second layers to specific ones of said leadframe leads or conductive traces, and a second series of bonding wires electrically connecting said first and second layers to said additional terminals on the IC chip, whereby to provide preselectable electrical interconnection of the IC chip; and h) a dielectric material encapsulating at least a portion of said integrated circuit assembly.

12. An integrated circuit assembly according to claim 11 wherein each of said elongated members is a solder column.

13. An integrated circuit assembly according to claim 12 wherein each of said elongated members is an attachment pin.

* * * * *

UNITED STATES PATENT AND TRADEMARK OFFICE
CERTIFICATE OF CORRECTION

PATENT NO. : 5,569,955
DATED : October 29, 1996
INVENTOR(S) : Chillara et al.

It is certified that error appears in the above-indentified patent and that said Letters Patent is hereby corrected as shown below:

Column 2, line 4, after "26A" delete --,--.

Column 8, line 64, after "of" insert --said--.

Signed and Sealed this

Twenty-fifth Day of February, 1997

Attest:

BRUCE LEHMAN

*Attesting Officer*     *Commissioner of Patents and Trademarks*